(12) United States Patent
Wu et al.

(10) Patent No.: US 6,670,272 B2
(45) Date of Patent: Dec. 30, 2003

(54) METHOD FOR REDUCING DISHING IN CHEMICAL MECHANICAL POLISHING

(75) Inventors: Shaoyu Wu, Singapore (SG); Joon Mo Kang, Singapore (SG); Pang Dow Foo, Singapore (SG)

(73) Assignee: Singapore Science Park II, Singapore (SG)

( * ) Notice: Subject to any disclaimer, the term of this patent is extended or adjusted under 35 U.S.C. 154(b) by 0 days.

(21) Appl. No.: 09/976,117

(22) Filed: Oct. 12, 2001

(65) Prior Publication Data

US 2003/0054649 A1 Mar. 20, 2003

(30) Foreign Application Priority Data

Sep. 17, 2001 (SG) .......................... 200105651

(51) Int. Cl.$^7$ ............................ H01L 21/302
(52) U.S. Cl. .................. 438/692; 438/691; 438/693; 438/633
(58) Field of Search ................ 438/633, 692, 438/693, 691, 689, 690; 257/752

(56) References Cited

U.S. PATENT DOCUMENTS

| | | | |
|---|---|---|---|
| 5,607,718 A | | 3/1997 | Sasaki et al. .................. 427/97 |
| 5,770,095 A | * | 6/1998 | Sasaki et al. .................. 216/38 |
| 6,017,803 A | | 1/2000 | Wong .......................... 438/430 |
| 6,149,830 A | | 11/2000 | Lin et al. ...................... 216/89 |
| 6,475,914 B2 | * | 11/2002 | Han ............................ 438/687 |
| 6,509,273 B1 | * | 1/2003 | Imai et al. ................... 438/693 |

OTHER PUBLICATIONS

Van Zant, Peter; Microchip Fabrication (2000), McGraw–Hill, Fourth Edition, p. 305.*
"Slurry Engineering For Self–Stopping, Dishing Free SIO2—CMP"; H. Nojo et al.; IEEE, IEDM 1996, pp. 349–352.

* cited by examiner

Primary Examiner—Carl Whitehead, Jr.
Assistant Examiner—David L. Hogans
(74) Attorney, Agent, or Firm—Conley Rose, P.C.

(57) ABSTRACT

A method is described for reducing dishing in a chemical mechanical polishing process performed on a semiconductor wafer having a dielectric layer with trenches and a copper layer deposited over the dielectric layer and filling the trenches in the dielectric layer. The method comprises steps of removing excess copper above the plane of the dielectric surface using a main polishing operation, whereby copper residues are formed above the plane of the dielectric surface, and applying chemical treatment to the surface of the semiconductor wafer in the initial stage of an overpolishing operation, wherein a protective layer over the copper residues and surfaces of copper-filled trenches is formed. The method further comprises steps of removing the copper residues and protective layer thereon above the plane of the dielectric layer in the overpolishing operation, and removing the protective layer over the surfaces of the copper-filled trenches in the overpolishing operation.

11 Claims, 3 Drawing Sheets

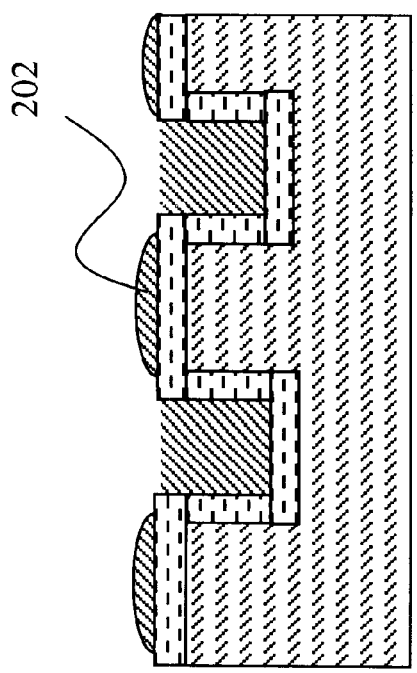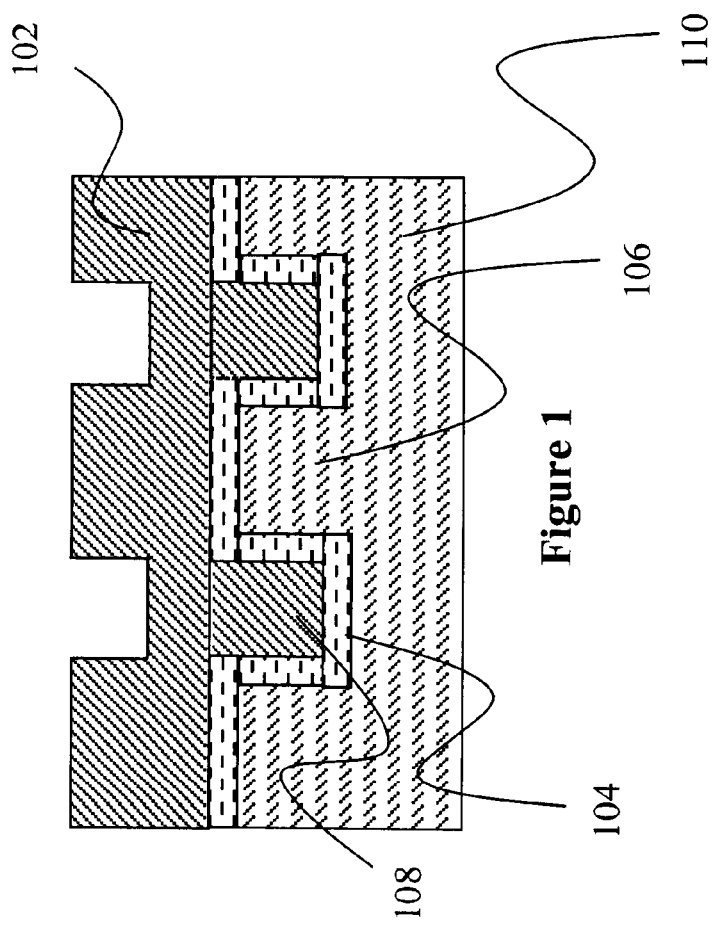

METHOD FOR REDUCING DISHING IN CHEMICAL MECHANICAL POLISHING

FIELD OF INVENTION

The invention relates to damascene processes in semiconductor wafer manufacture. In particular, the invention relates to chemical mechanical polishing (CMP) processes applied during damascene processes.

BACKGROUND

In the semiconductor industry, copper is replacing aluminium as a metal for forming conductive interconnects and bond pads in semiconductor wafers. This is because when compared to aluminium, copper has lower electrical impedance and higher electromigration resistivity. However, as there are no known conventional technologies for etching a copper pattern in the semiconductor industry, a conventional copper damascene technology is therefore used for forming copper conductive interconnects in wafers.

A conventional damascene process begins by the formation of a dielectric layer over a wafer substrate. The dielectric is patterned, for example using photolithography to form a photoresist layer for providing a mask for etching the dielectric. By etching, trenches are then formed in the dielectric which are defined on the sides by the dielectric and on the bottom by the substrate. A layer of conformal conductive material or metal such as copper is deposited over the patterned dielectric, whereby the trenches therein are filled. The wafer surface is then polished to achieve a substantially planar dielectric surface and remove any excess or residue conductive material or metal while leaving behind the conductive material or metal in the trenches in the patterned dielectric. In a copper damascene process, electrochemical plating of copper is applied to deposit a layer of copper over the dielectric pattern after which CMP processing is used to remove any excess or residue copper on the wafer surface.

Conventional abrasive CMP technologies are currently used in the semiconductor industry for forming a copper pattern in a wafer. A typical abrasive copper CMP process primarily includes a sequence of steps shown respectively in FIGS. 1 to 4. The first step involves the deposition of copper 102 over a conformal barrier layer 104 earlier deposited over a patterned dielectric layer 106 as shown in FIG. 1. The patterned dielectric layer 106 contains trenches 108 in which copper 102 is filled, which is defined at the bottom by the top of a substrate 110 upon which the dielectric 106 is based. The next step involves the removal of excess copper 102 above the plane of the dielectric 106 surface during a main polishing operation in which excess copper 102 detected by an end point detector is removed as shown in FIG. 2. This step, however, still leaves behind copper residues 202 forming mounds of copper and the underlying barrier layer 104 which lie above the plane of the surface of the dielectric layer 106. Therefore, an overpolishing operation is necessary to remove the copper residues 202 and barrier layer 104.

At the initial stage of the overpolishing operation, initial dishing or concavity 302 on the surfaces of the copper-filled trenches 108 begins to show, as shown in FIG. 3, even though some copper residues 202 still remain. However, the dishing problem worsens as severe dishing 402 arises when the overpolishing operation is completed at the end of the abrasive copper CMP process, which removes all copper residues 202 and the barrier layer 104 which previously lie above the plane of the dielectric surface as shown in FIG. 4. The severe dishing 402 which occurs at the end of the abrasive CMP process results in adverse consequences, affecting not only the resistance of copper conductive pattern, but also planarity of wafer which deteriorates subsequent lithography performance.

A conventional abrasive CMP process typically involves holding a wafer against a rotating wetted polishing pad surface under a controlled downward pressure. A polishing slurry such as a mixture of a chemical etch component and abrasive particles may be used. A rotating head or wafer carrier is typically used to hold the wafer under controlled pressure against a rotating polishing platen, which is typically covered with a polishing pad material for polishing the wafer.

A number of proposals are currently available for reducing dishing or concavity. Of particular note are proposals involving polishing slurries. In U.S. Pat. No. 5,607,718, a number of compounds are added to polishing slurry to decrease solution velocity thereby suppressing dishing. In U.S. Pat. No. 6,149,830, a viscosity modifier is added to polishing slurry to increase the viscosity of the polishing slurry for reducing dishing. In U.S. Pat. No. 5,770,095, a chemical agent is added to polishing slurry to form a protective film during CMP processing and to suppress the occurrence of dishing. In an article entitled "slurry engineering for self-stopping, dishing free $SiO_2$-CMP", IEDM, pages 349–352, 1996 IEEE, a surfactant is added to polishing slurry for obtaining global planarization.

Also notable are proposals relating to the rate of polishing during CMP processing. In U.S. Pat. No. 6,017,803, at least two metallic materials are deposited to form a damascene structure and the CMP process is used to remove the excess metals. No dishing occurs because there is control of the removal rates of different materials. In U.S. Pat. No. 5,618,381, a protective layer such as titanium is used before CMP processing, which may reduce dishing by controlling the removal rates of different materials.

Other proposals are also currently available for reducing dishing or concavity. Such proposals either involve improving polishing uniformity by improving polishing pad design or polishing pad material, or using a dummy structure for providing a more uniform slurry distribution.

Accordingly, there is a need for an alternative method for reducing dishing during CMP processing for addressing problems caused by dishing such as increasing the resistance of copper conductive patterns and reducing the planarity of wafers.

SUMMARY

In accordance with a first aspect of the invention there is described a method for reducing dishing in a chemical mechanical polishing process performed on a semiconductor wafer having a dielectric layer with trenches and a copper layer deposited over the dielectric layer and filling the trenches in the dielectric layer. The method comprises steps of removing excess copper above the plane of the dielectric surface using a main polishing operation, whereby copper residues are formed above the plane of the dielectric surface, and applying chemical treatment to the surface of the semiconductor wafer in the initial stage of an overpolishing operation, wherein a protective layer over the copper residues and surfaces of copper-filled trenches is formed. The method further comprises steps of removing the copper residues and protective layer thereon above the plane of the dielectric layer in the overpolishing operation, and removing the protective layer over the surfaces of the copper-filled trenches in the overpolishing operation.

In accordance with a second aspect of the invention there is described in a method for reducing dishing in a chemical mechanical polishing process performed on a semiconductor wafer having a dielectric layer with trenches and a copper layer deposited over the dielectric layer and filling the trenches in the dielectric layer, the method comprising steps of removing excess copper above the plane of the dielectric surface using a main polishing operation, whereby copper residues are formed above the plane of the dielectric surface; applying chemical treatment to the surface of the semiconductor wafer in the initial stage of an overpolishing operation, wherein a protective layer over the copper residues and surfaces of copper-filled trenches is formed; removing the copper residues and protective layer thereon above the plane of the dielectric layer in the overpolishing operation; and removing the protective layer over the surfaces of the copper-filled trenches in the overpolishing operation, a chemical solution used for the chemical treatment, the chemical solution being introduced to the surface of the semiconductor wafer which reacts with the copper or is chemisorbed onto the surface of copper for forming the protective layer.

BRIEF DESCRIPTION OF DRAWINGS

Embodiments of the invention are described hereinafter with reference to the drawings, in which:

FIG. 1 shows a cross section of a part of a wafer having substrate, dielectric, and copper layers during a conventional CMP process;

FIG. 2 shows a cross section of a part of the wafer of FIG. 1 in which the copper layer is removed during the conventional CMP process;

DETAILED DESCRIPTION

Figure 4:
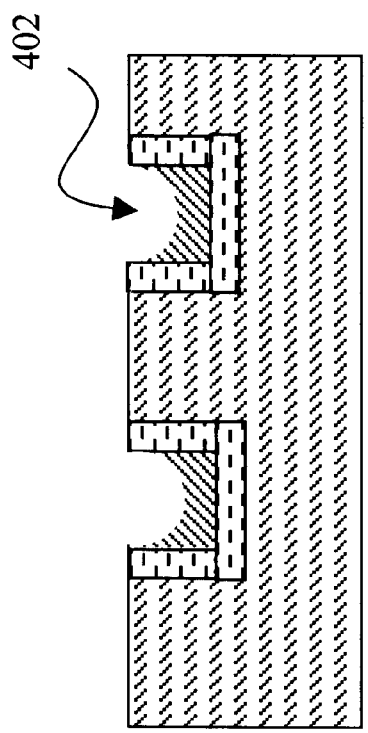
FIG. 4 shows a cross section of a part of the wafer of FIG. 1 in which copper residues and a barrier layer is removed, in which severe dishing results after the conventional CMP process.

The need for an alternative method for reducing dishing during CMP processing for addressing problems caused by dishing such as increasing the resistance of copper conductive patterns and reducing the planarity of wafers is satisfied by a method according to an embodiment of the invention.

The method when applied to the manufacture of semiconductor wafers is for reducing dishing of copper areas such as interconnects or bond pads which occurs during chemical mechanical polishing (CMP) processing. After applying a main polishing operation in which the excess copper is removed, an overpolishing operation is applied during which initial dishing begins, where the overpolishing operation is applied to remove copper residues and a barrier layer underlying the removed excess copper. At the initial stage of the overpolishing operation, chemical treatment is applied to the wafer to form a protective layer over the copper residues, the barrier layer, and concavities or recesses in the copper-filled trenches due to initial dishing. The protective layer in places over the copper residues is preferably removed by continuing the overpolishing operation during which a hard polishing pad is used. However, the protective layer over the recesses may prevent wet etch from chemicals contained in a polishing slurry which is used during the overpolishing operation. Thus, severe dishing is greatly reduced when the overpolishing operation is completed at the end of the CMP process. The protective layer over the recesses is preferably removed by polishing using a soft pad before the end of the CMP polishing process.

The method involves chemical treatment being applied at least once to the wafer during the overpolishing operation in CMP processing. The chemicals used in process include organic and polymeric materials or mixtures thereof which react with copper or be chemisorbed onto copper surfaces to form protective layer.

A method according to a preferred embodiment of the invention is described in greater detail hereinafter. Conventional abrasive CMP technologies are used in the method for reducing dishing while forming a copper pattern in a wafer. An abrasive copper CMP process according to the method primarily includes a sequence of steps shown respectively in FIGS. 1 to 3, 5 and 6. The first step involves the deposition of copper 102 over a conformal barrier layer 104 earlier deposited over a patterned dielectric layer 106 as shown in FIG. 1. The patterned dielectric layer 106 contains trenches 108 in which copper 102 is filled, which is defined at the bottom by the top of a substrate 110 upon which the dielectric 106 is based. The next step involves the removal of excess copper 102 above the plane of the dielectric 106 surface during a main polishing operation in which excess copper 102 detected by an end point detector is removed as shown in FIG. 2. This step, however, still leaves behind copper residues 202 and the underlying barrier layer 104 which lie above the plane of the surface of the dielectric layer 106. Therefore, an overpolishing operation is necessary to remove the copper residues 202 and barrier layer 104.

Figure 3:
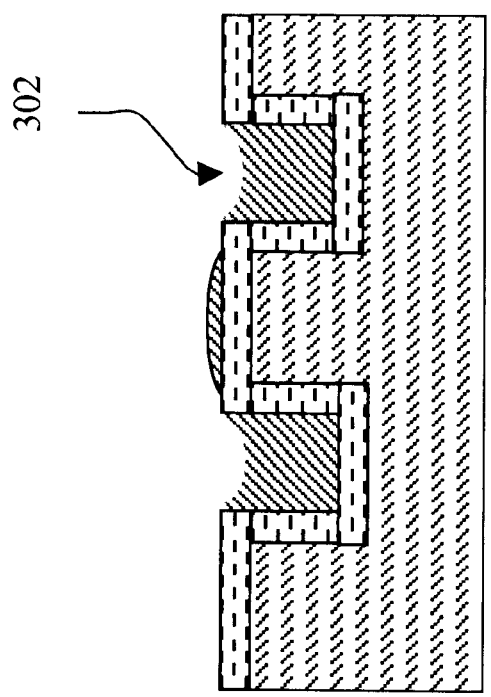
FIG. 3 shows a cross section of a part of the wafer of FIG. 1 in which an overpolishing operation begins and dishing occurs but copper residues are not completely removed during the conventional CMP process.
Figure 6:
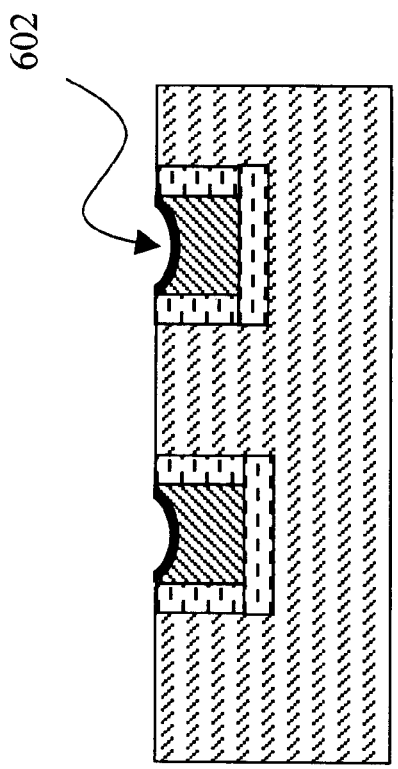
FIG. 6 shows a cross section of a part of a wafer of FIG. 1 after final overpolishing to completely remove copper residue and barrier layer after the modified CMP process of FIG. 5.
Figure 5:
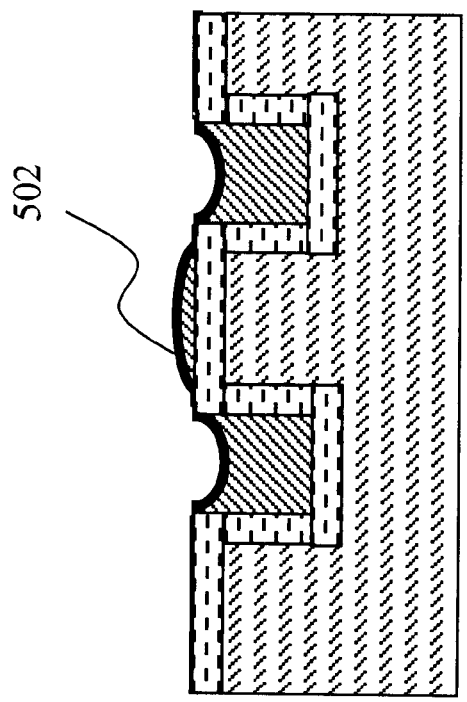
FIG. 5 shows a cross section of a part of the wafer of FIG. 1 after chemical treatment is applied to the wafer to form a protective layer on the copper surface during the initial stage of the polishing operation of FIG. 3 in accordance with a modified CMP process according to an embodiment of the invention.

At the initial stage of the overpolishing operation, initial dishing or concavity 302 on the surfaces of the copper-filled trenches 108 begins to show, as shown in FIG. 3, even though some copper residues 202 still remain. At this stage, chemical treatment is applied to form a protective layer 502 over the surfaces of copper residues 202, the barrier layer 104, and concavities or recesses 302 in the copper-filled trenches 107 due to initial dishing, by chemical reaction or chemisorption as shown in FIG. 5. After the protective layer 502 is formed, the overpolishing operation is continued to remove the copper residues 202 and barrier layer 104. The chemical treatment may be applied more than once during the overpolishing operation. The protective layer 502 over the copper residues 202 may be removed during the overpolishing operation using for example a hard polishing pad under conventional overpolishing operation conditions. However, the protective layer 502 over the recesses 302 is able to withstand the wet etch of chemicals in the polishing slurry used during the overpolishing operation, and the dishing problem is correspondingly alleviated in respect of the recesses 302 after the protective layer 502 is removed as shown in FIG. 6. The protective layer 502 over the recesses 302 may be removed using a soft polishing pad applying conventional overpolishing operation conditions.

A conventional abrasive CMP process typically involves holding a wafer against a rotating wetted polishing pad surface under a controlled downward pressure. A polishing slurry such as a mixture of a chemical etch component and abrasive particles may be used. A rotating head or wafer carrier is typically used to hold the wafer under controlled pressure against a rotating polishing platen, which is typically covered with a polishing pad material for polishing the wafer.

The chemical treatment at initial overpolishing operation occurs when a chemical solution is introduced to the surface of the wafer, which remains to be held by a wafer carrier against a rotating polishing platen covered with a polishing pad throughout the chemical treatment. During application of the chemical solution, the downward pressure applied during polishing is held off and no vacuum is required for the chemical treatment, which occurs under room temperature. The chemical treatment is continued until the protective layer 502 is preferably 10–100 nm thick.

Using a conventional CMP process, dishing may be found to be more than 600 Å. Using the CMP process according to the method, less than 200 Å of dishing is achievable.

The chemical solution used in the chemical treatment includes aqueous or organic solutions, the concentration of which range from 0.0001 M to 1.0 M. The chemical solution includes organic compounds containing relevant functional groups and corresponding polymers as well as mixtures thereof.

Examples of organic solvents used in the chemical solution include dioxane and derivatives, alcohol, acetone, aldehyde, and ether and derivatives.

Examples of organic compounds used in the chemical solution include benzotriazole (BTA) and derivatives, imidazole and derivatives, amino compounds, amide compounds, epoxide compounds, organic acid and corresponding anhydrides, siloxane etc.

Examples of polymer used in the chemical solution include any polymer containing the same functional groups as above-mentioned organic compounds.

In the foregoing manner, there is described an alternative method for reducing dishing during CMP processing for addressing problems caused by dishing such as increasing the resistance of copper conductive patterns and reducing the planarity of wafers. Although only a number of embodiments of the invention are disclosed, it becomes apparent to one skilled in the art in view of this disclosure that numerous changes and/or modification can be made without departing from the scope and spirit of the invention.

What is claimed is:

1. A method for reducing dishing in a chemical mechanical polishing process performed on a semiconductor wafer having a dielectric layer with trenches and a copper layer deposited over the dielectric layer and filling the trenches in the dielectric layer, the method comprising steps of:
   removing excess copper above the plane of the dielectric surface using a main polishing operation, whereby copper residues are formed above the plane of the dielectric surface;
   applying chemical treatment to the surface of the semiconductor wafer in the initial stage of an overpolishing operation, wherein a protective layer over the copper residues and surfaces of copper-filled trenches is formed;
   removing polishing pressure during the overpolishing operation when applying chemical treatment to the surface of the semiconductor wafer;
   removing the copper residues and protective layer thereon above the plane of the dielectric layer in the overpolishing operation; and
   removing the protective layer over the surfaces of the copper-filled trenches in the overpolishing operation.

2. The method as in claim 1, wherein the step of removing the copper residues and protective layer thereon comprises step of using a hard polishing pad during the overpolishing operation.

3. The method as in claim 1, wherein the step of removing the protective layer over the surfaces of the copper-filled trenches comprises step of using a soft polishing pad during the overpolishing operation.

4. The method as in claim 1, wherein the step of applying chemical treatment comprises step of introducing a chemical solution to the surface of the semiconductor wafer which reacts with the copper or is chemisorbed onto the surface of copper for forming the protective layer.

5. The method as in claim 4, wherein the step of introducing a chemical solution comprises step of introducing an organic compound or mixtures thereof.

6. The method as in claim 5, wherein the step of introducing the organic compound comprises step of introducing an organic compound selected from a group consisting of benzotriazole, imidazole, pyridines, epoxide compounds, amino compounds, amide compounds, organic acid, anhydrides, triazine, and siloxane.

7. The method as in claim 4, wherein the step of introducing a chemical solution comprises step of introducing a polymer or mixtures thereof.

8. The method as in claim 7, wherein the step of introducing the polymer comprises step of introducing a polymer selected from a group consisting of polymers containing functional groups present in benzotriazole, imidazole, pyridines, epoxide compounds, amino compounds, amide compounds, organic acid, anhydrides, triazine, and siloxane.

9. The method as in claim 1, wherein the step of applying chemical treatment to the surface of the semiconductor wafer comprises step of applying chemical treatment to exposed surfaces of a conformal barrier layer which separates the copper and dielectric layers after the excess copper above the plane of the dielectric layer is removed.

10. The method as in claim 9, wherein the step of removing the copper residues and protective layer thereon above the plane of the dielectric layer in an overpolishing operation comprises the step of removing the conformal barrier layer in the overpolishing operation.

11. The method as in claim 1, wherein the steps of
   applying chemical treatment to the surface of the semiconductor wafer, wherein a protective layer over the copper residues and surfaces of copper-filled trenches is formed;
   removing the copper residues and protective layer thereon above the plane of the dielectric layer in an overpolishing operation; and
   removing the protective layer over the surfaces of the copper-filled trenches in the 5 overpolishing operation
   are repeated.

* * * * *

UNITED STATES PATENT AND TRADEMARK OFFICE
CERTIFICATE OF CORRECTION

PATENT NO.   : 6,670,272 B2
DATED        : December 30, 2003
INVENTOR(S)  : Wu et al.

It is certified that error appears in the above-identified patent and that said Letters Patent is hereby corrected as shown below:

<u>Title page,</u>
Item [73], Assignee, should read:
-- [73] Assignee: Institute of Microelectronics, Singapore --
Item [30], Foreign Application Priority Data, should read:
-- Sep. 17, 2001 (SG) ..................... 200105651-4 --

Signed and Sealed this

Sixth Day of April, 2004

JON W. DUDAS
*Acting Director of the United States Patent and Trademark Office*